(12) United States Patent
Han

(10) Patent No.: US 9,093,668 B2
(45) Date of Patent: Jul. 28, 2015

(54) DISPLAY APPARATUS HAVING SEALING PORTION AND FABRICATION METHOD THEREOF

(71) Applicant: Samsung Display Co., LTD., Yongin,Gyeonggi-do (KR)

(72) Inventor: Byung-Uk Han, Yongin (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 14/010,453

(22) Filed: Aug. 26, 2013

(65) Prior Publication Data
US 2014/0306192 A1   Oct. 16, 2014

(30) Foreign Application Priority Data
Apr. 16, 2013   (KR) .................. 10-2013-0041834

(51) Int. Cl.
*H01L 21/31* (2006.01)
*H01L 51/56* (2006.01)
*H01L 21/56* (2006.01)
*H01L 51/52* (2006.01)

(52) U.S. Cl.
CPC ............. *H01L 51/56* (2013.01); *H01L 21/56* (2013.01); *H01L 51/5246* (2013.01)

(58) Field of Classification Search
USPC ........... 438/25, 26, 29, 55, 64, 799, 727, 792, 438/798
See application file for complete search history.

(56) References Cited

U.S. PATENT DOCUMENTS

| | | | |
|---|---|---|---|
| 8,440,479 B2 * | 5/2013 | Nguyen et al. | 438/29 |
| 2005/0142974 A1 | 6/2005 | Lee | |
| 2014/0087099 A1 * | 3/2014 | Veerasamy et al. | 428/34 |

FOREIGN PATENT DOCUMENTS

| | | |
|---|---|---|
| KR | 10-2005-0068860 A | 7/2005 |
| KR | 10-2005-0069969 A | 7/2005 |
| KR | 10-2006-0023497 A | 3/2006 |
| KR | 10-2007-0078501 A | 8/2007 |

* cited by examiner

*Primary Examiner* — Quoc Hoang
(74) *Attorney, Agent, or Firm* — Christie, Parker & Hale, LLP

(57) ABSTRACT

A display apparatus includes a sealing portion. A method for fabricating the sealing portion includes: irradiating a pulse laser beam onto a deposition target to form the sealing portion at an edge where a substrate and an encapsulation face each, wherein a display unit is formed on the substrate, and the encapsulation is configured to seal the substrate; bonding the substrate and the encapsulation to each other; hardening the sealing portion; and monitoring the sealing portion. Thus, structural strength of the sealing portion is improved.

10 Claims, 5 Drawing Sheets

DISPLAY APPARATUS HAVING SEALING PORTION AND FABRICATION METHOD THEREOF

CROSS-REFERENCE TO RELATED APPLICATION

This application claims priority to and the benefit of Korean Patent Application No. 10-2013-0041834, filed on Apr. 16, 2013, in the Korean Intellectual Property Office, the entire content of which is incorporated herein by reference.

BACKGROUND

1. Field

The following description relates to a display apparatus including a sealing portion having improved reliability and a fabrication method thereof.

2. Description of the Related Art

In general, a display apparatus, such as an organic light-emitting display device including a thin film transistor (TFT), is applied to a mobile device such as a smart phone, a tablet personal computer (PC), a super-slim notebook, a digital camera, a video camera, or personal digital assistant (PDA), or an electronic/electrical product such as a super-thin TV or the like. Here, in these device and product applications, the display apparatus has taken center stage.

In the organic light-emitting display device, upper and lower substrates are sealed to protect an organic light-emitting device from the outside. For this purpose, a sealing material is coated and hardened between the upper and lower substrates to bond the upper and lower substrates to each other. When the sealing material is sealed, bonding is to be uniformly performed in order to maintain structural strength.

SUMMARY

Aspects of embodiments of the present invention are directed toward a display apparatus having a sealing portion, wherein structural strength is maintained to improve reliability, and a fabrication method thereof.

According to an embodiment of the present invention, a method of fabricating a sealing portion of a display apparatus includes: irradiating a pulse laser beam to a deposition target to form the sealing portion at an edge at which a substrate and an encapsulation face each other, wherein a display unit is formed on the substrate, and the encapsulation is configured to seals the substrate; bonding the substrate and the encapsulation to each other; hardening the sealing portion; and monitoring the sealing portion.

The sealing portion may be formed at an edge of at least one of the substrate and the encapsulation.

The sealing portion may be formed through a low temperature process of 40° C. or less.

The sealing portion may be continuously formed along an edge of the display unit.

The forming of the sealing portion may include: inserting a deposition substrate including one of the substrate and the encapsulation into a chamber to install the deposition substrate on a substrate holder; installing a deposition target on a target holder that is installed to correspond to the substrate holder; and forming the sealing portion on the deposition substrate by using particles generated by irradiating a laser beam onto the deposition target from a laser irradiator installed outside the chamber.

A laser beam generated from the laser irradiator may be a pulse laser beam.

The sealing portion may be formed in a vacuum chamber.

A laser beam may be irradiated from a laser system installed outside the substrate and the encapsulation that are bonded to each other, to harden the sealing portion.

The laser system may include a temperature sensor to measure a surface temperature of a part onto which the laser beam is irradiated, in order to control an output and a speed of the laser irradiator.

A quality of the sealing portion may be monitored through a laser ablation system.

The sealing portion may include glass frit.

According to another embodiment of the present invention, there is provided a display apparatus including: a substrate on which a display unit is formed; an encapsulation which seals the substrate; and a sealing portion which is between the substrate and the encapsulation, wherein the sealing portion is deposited and hardened according to a pulse laser irradiation.

The display unit may include: a thin film transistor (TFT); and an organic light-emitting device which is electrically connected to the TFT and includes a first electrode, a second electrode, and an organic layer formed between the first and second electrodes.

The sealing portion may include glass frit.

The sealing portion may be formed at an edge at which the substrate and the encapsulation face each other.

The sealing portion may be continuously formed along an edge of the display unit.

The sealing portion may be formed by using a pulse laser system which include a deposition substrate holder that is installed in a side of a chamber configured to fix the substrate or the encapsulation, a target holder that is installed in another side of the chamber configured to fix a deposition target, and a laser irradiator that is configured to irradiate a laser beam onto the deposition target.

BRIEF DESCRIPTION OF THE DRAWINGS

The above and other features and enhancements of the present invention will become more apparent by describing in more detail some example embodiments thereof with reference to the attached drawings in which.

DETAILED DESCRIPTION

Figure 1:
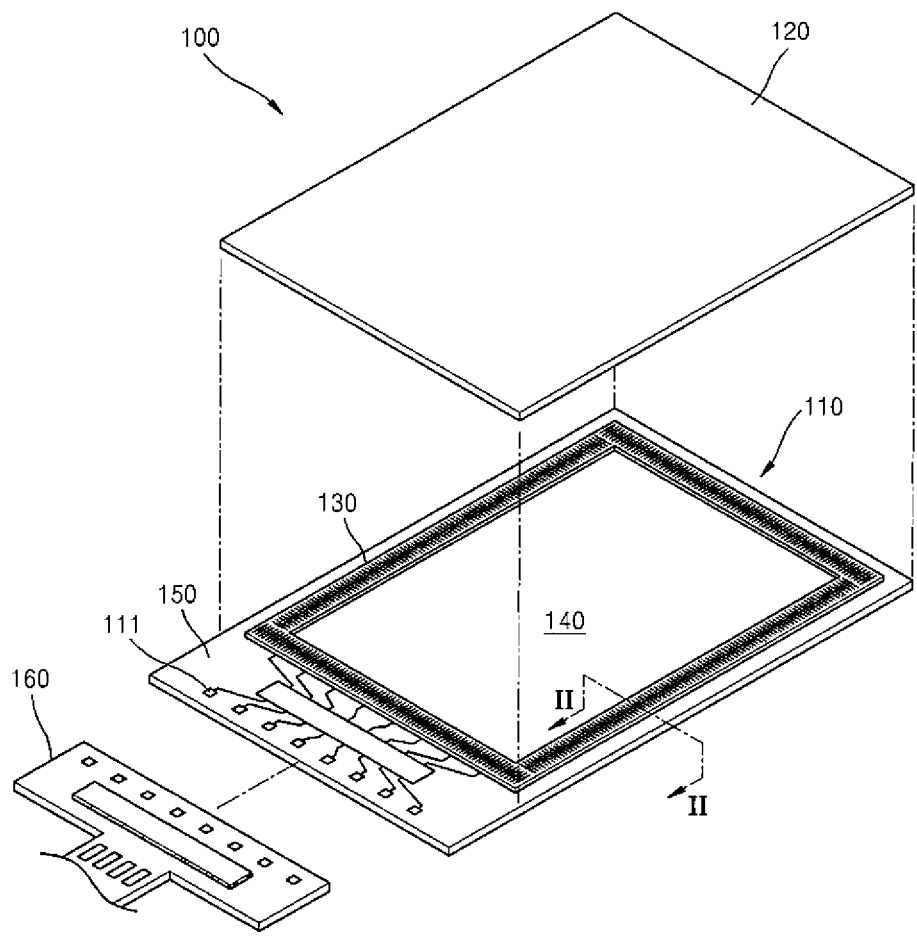
FIG. 1 is an exploded perspective view illustrating a display apparatus according to an embodiment of the present invention.

While example embodiments are capable of various modifications and alternative forms, embodiments thereof are shown by way of example in the drawings and will herein be described in more detail. It should be understood, however, that there is no intent to limit example embodiments to the particular forms disclosed, but on the contrary, example embodiments are to cover all modifications, equivalents, and alternatives falling within the scope of the invention.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be described in more detail by explaining embodiments of the invention with reference to the attached drawings. Like reference numerals in the drawings denote like elements.

FIG. 1 is an exploded perspective view illustrating a display apparatus 100 according to an example embodiment of the present invention.

Referring to FIG. 1, the display apparatus 100 includes a substrate 110, an encapsulation 120 that covers the substrate 110, and a sealing portion 130 that is formed between the substrate 110 and the encapsulation 120.

The substrate 110 may be a glass substrate such as a soda lime glass or may be formed of an insulating polymer material. The substrate 110 includes a display unit 140 that displays an image and a non-display unit 150 that is formed outside the display unit 140. The display unit 140 includes an organic light-emitting device in the present example embodiment but is not limited thereto. Therefore, the display unit 140 may include another kind of device such as a liquid crystal device.

A plurality of terminals 111 are arrayed at an edge of the substrate 110, and a flexible printed circuit board (FPCB) 160 is connected to the plurality of terminals 111.

The encapsulation 120 is disposed to face (to be opposite to) the substrate 110. The encapsulation 120 may be formed of glass, an insulating polymer resin, a flexible film, a thin film having a stack of an organic layer and an inorganic layer, or the like.

The sealing portion 130 is interposed between the substrate 110 and the encapsulation 120. The sealing portion 130 is formed along an edge of a part of the substrate 110 facing the encapsulation 120

The sealing portion 130 may be formed at the non-display unit 150 along an edge of the display unit 140. The sealing portion 130 is formed in a continuous band shape along the edge of the display unit 140. The sealing portion 130 includes glass frit.

In the display apparatus 100 having the above-described structure, the sealing portion 130 is formed in one area of the substrate 110 and the encapsulation 120, the substrate 110 and the encapsulation 120 are arrayed, a laser beam is irradiated from the outside of the display apparatus 100. In this case, the sealing portion 130 interposed between the substrate 110 and the encapsulation 120 is hardened.

A process of fabricating the sealing portion 130 will now be described in more detail.

Figure 2:
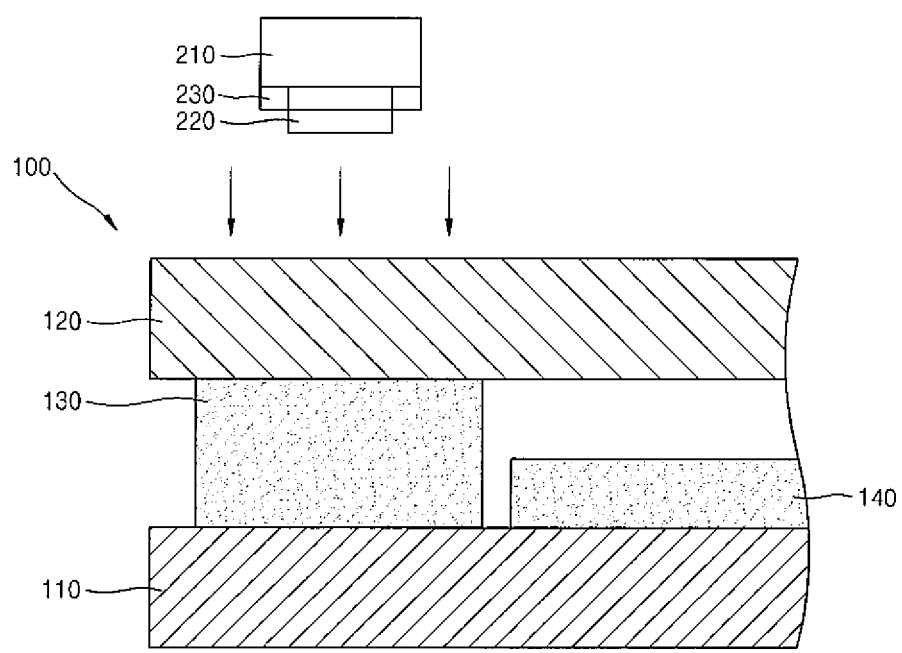
FIG. 2 is a cross-sectional view illustrating an enlarged periphery of a sealing portion of FIG. 1.
Figure 3:
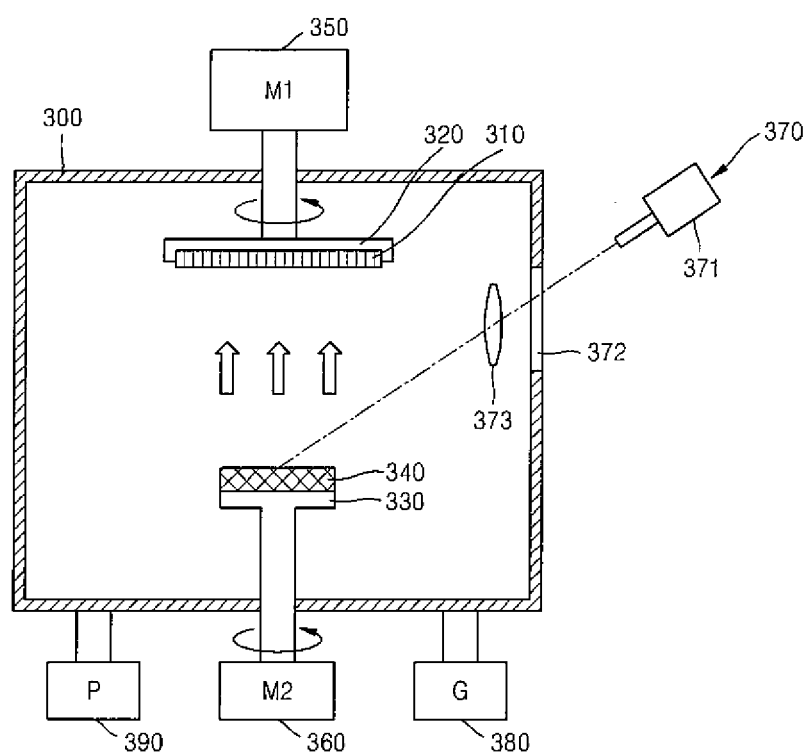
FIG. 3 is a view illustrating an inside of a chamber for forming the sealing portion of FIG. 1.
Figure 4:
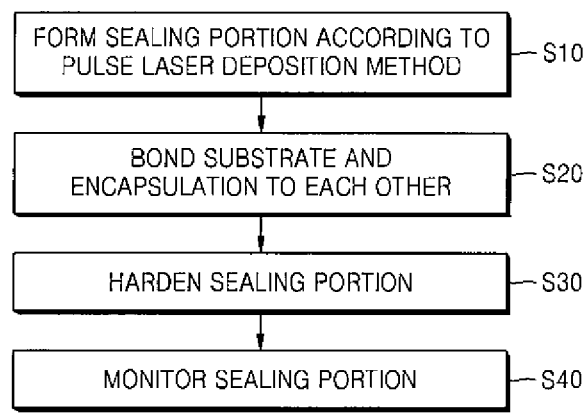
FIG. 4 is a flowchart illustrating a process of fabricating the sealing portion of FIG. 1.

FIG. 2 is a cross-sectional view illustrating an enlarged periphery of the sealing portion 130 of FIG. 1. FIG. 3 is a view illustrating an inside of a chamber 300 for forming the sealing portion of FIG. 1. FIG. 4 is a flowchart illustrating a process of fabricating the sealing portion 130 of FIG. 1.

The sealing portion 130 is formed at the edge of the substrate 110 on which the display unit 140 is formed and which faces the encapsulation 120 that seals the substrate 110. In operation S10, the sealing portion 130 may be formed by depositing the sealing material only at the edge of the substrate 110, only at an edge of the encapsulation 120, or at both edges of the substrate 110 and the encapsulation 120.

For this purpose, one (hereinafter referred to as a deposition substrate 310) of the substrate 110 and the encapsulation 120 is inserted into the chamber 300. The chamber 300 provides a deposition space and may be a vacuum chamber. A substrate holder 320 and a target holder 330 are installed inside the chamber 300. The substrate holder 320 installs the deposition substrate 310, and a deposition target 340 is installed on the target holder 330.

In the present example embodiment, the substrate holder 320 that installs the deposition substrate 310 is installed in an upper part of the chamber 300. Also, the target holder 330 on which the deposition target 340 is installed is installed in a lower part of the chamber 300. However, positions of the substrate holder 320 and the target holder 330 are not limited thereto.

The substrate holder 320 supports the deposition substrate 310 provided into the chamber 300. The substrate holder 320 holds the deposition substrate 310 through a surface opposite to the surface on which the sealing material is to be deposited using vacuum, or supports the deposition substrate 310 through a clamp member. The substrate holder 320 is rotated in one direction by a first motor 350.

A heater may be further installed at the substrate holder 320 to heat the deposition substrate 310 so that a deposition material is easily deposited on the deposition substrate 310.

The target holder 330 fixes the deposition target 340 formed of a raw material to be deposited on the deposition substrate 310. In the present example embodiment, the sealing portion 130 of FIG. 1 is formed by depositing the sealing material on the deposition substrate 310, and thus the deposition target 340 includes glass frit. The target holder 330 is rotated in one direction by a second motor 360.

A laser irradiator 370 is installed in an upper part outside the chamber 300. The laser irradiator 370 irradiates a laser beam onto the deposition target 340. The laser beam is generated by a laser generator 371, passes through a lens unit 372, is focused by a focus lens 373, and has high energy to be irradiated onto the deposition target 340. If the laser beam is irradiated onto the deposition target 340, plasma is formed, and thus nanoparticles are generated from the deposition target 340.

The laser beam generated by the laser generator 371 may be generated by using a pulse laser, for example, an excimer laser, a Nd:YAG laser, or the like to instantaneously heat and evaporate (peel) a surface of the deposition target 340. The excimer laser generates the laser beam having energy within a particular range per pulse by using a particular gas such as KrF.

A reaction gas that is provided to form the plasma particles may be argon (Ar) gas or the like that is an activated gas. A gas supply unit 380 is combined with the chamber 300 to supply the gas into the chamber 300.

A vacuum pump 390 is installed at the chamber 300 to form the vacuum.

The sealing portion 130 of FIG. 1 may be formed along the edge of the deposition substrate 310 according to a pulse laser deposition method as described above. If the sealing portion 130 is formed using low temperature deposition according to the pulse laser deposition method, a uniformity of a thickness of a cell seal improves compared to when forming the sealing portion 130 according to a general screen printing method. Therefore, a deviation of a strength characteristic of the sealing portion 130 is resolved.

In the screen printing method, a paste used for a sealing portion is fabricated and printed on the deposition substrate 310, pre-baking is performed to remove an organic binder, and a sealing process is performed at a temperature of 400° C. When the paste is provided in a metastable state according to the above-described method, the paste becomes a useable state when a laser sealing process is performed in a subsequent sealing process.

On the contrary, the pulse laser deposition method of the present example embodiment is a process of irradiating a laser beam onto the deposition target 340 to deposit a sputtered material on the deposition substrate 310. Therefore, an additional cooling device is not needed for the deposition substrate 310.

Accordingly, in the pulse laser deposition method of the present example embodiment, although a temperature of the deposition substrate 310 rises due to energy of the sputtered material, the deposition substrate 310 may be controlled at a low temperature of 40° C. or less. As described above, the pulse laser deposition method of the present example embodiment performs a deposition by using a laser pulse method and thus may omit a thermal process such as a pre-baking process or a sealing process of the screen printing method.

The sealing portion 130 may be formed through a low temperature process without a distinction between the substrate 110 and the encapsulation 120.

In other words, the sealing portion 130 may be formed by depositing the sealing material on at least one of the substrate 110 and the encapsulation 120. The encapsulation 120 is not restricted by a temperature and thus may endure a temperature of about 500° C. However, a thin film transistor (TFT) and an organic light emitting diode (OLED) are formed on the substrate 110, and a temperature of 70° C. or more should not be applied. Therefore, a temperature of 70° C. or less is maintained in a process of depositing the sealing portion 130. A process temperature of 40° C. or less may be maintained according to the pulse laser deposition method.

According to the pulse laser deposition method, the deposition substrate 310 on which the sealing portion 130 is formed, for example, one of the substrate 110 and the encapsulation 120, is arrayed above or under the other one of the encapsulation 120 and the substrate 110, and combined with each other. If the array is completed, the substrate 110 and the encapsulation 120 are bonded to each other. In operation S20, the sealing portion 130 is formed in one area of the edge of the substrate 110 and the edge of the encapsulation 120 to bond the substrate 110 and the encapsulation 120 to each other.

In operation S30, an in-situ laser sealing process is performed by using a laser source to harden the sealing portion 130.

When sealing is performed by using a laser beam, a good reproducibility of laser sealing may be secured through a temperature control method. In other words, as shown in FIG. 2, when the sealing portion 130 is hardened by using a laser system 210 from the outside of the substrate 110 and the encapsulation 120 that are bonded to each other, a temperature sensor 230 is installed at a laser head 220 to measure a surface temperature of the sealing portion 130 to be hardened in order to control laser output and speed. The surface temperature of the sealing portion 130 may be measured by using a contactless thermal infrared temperature sensing method.

In general, a laser sealing process is a simple control method performed through a given power. However, a laser sealing process of the present example embodiment is a method to measure and maintain the surface temperature of the sealing portion 130 by controlling the power. Therefore, it is possible to uniformly and accurately control the sealing portion 130 in order to maintain the surface temperature of the sealing portion 130.

In operation S40, the sealing portion 130 is monitored to check a quality of the sealing portion 130 that has been hardened.

In general, several kinds of effective parameters of the sealing portion 130 are observed by using a microscope to check the quality of the sealing portion 130. However, in this case, the effective parameters have little relation with a quality characteristic of the sealing portion 130, for example, apparatus strength, shock resistance, a contact characteristic, etc.

In the present example embodiment, the sealing portion 130 is hardened by the laser beam, and thus a monitoring evaluation of a layer characteristic may be performed by monitoring with respect to hardness of the sealing portion 130 through a laser ablation system when the substrate 110 and the encapsulation 120 are bonded to each other.

In other words, a thermal shock is applied to the sealing portion 130 according to laser outputs (for example, in the case of the excimer laser, wavelengths of 157 nm, 193 nm, 222 nm, 248 nm, 308 nm, and 351 nm) to perform a monitoring process by using a system that may perform in-situ monitoring such as observation of a micro structure, degradation behavior of a phase change, or the like of the sealing portion 130, checking whether peeling occurs, etc.

As described above, to improve reliability of the sealing portion 130 of the present example embodiment, a pattern is formed at a low temperature according to the pulse laser deposition method, hardened by using a laser system capable of controlling a temperature, and monitored through a laser ablation method.

A pulse laser system is a system for forming the pattern of the sealing portion 130, a laser sealing system is a system for hardening the sealing portion 130, and a monitoring laser system is a system for monitoring the sealing portion 130. The pulse laser system, the laser sealing system, and the monitoring laser system may be respectively constituted as independent systems, but the pulse laser system and the monitoring laser system may use the same laser system.

Figure 5:
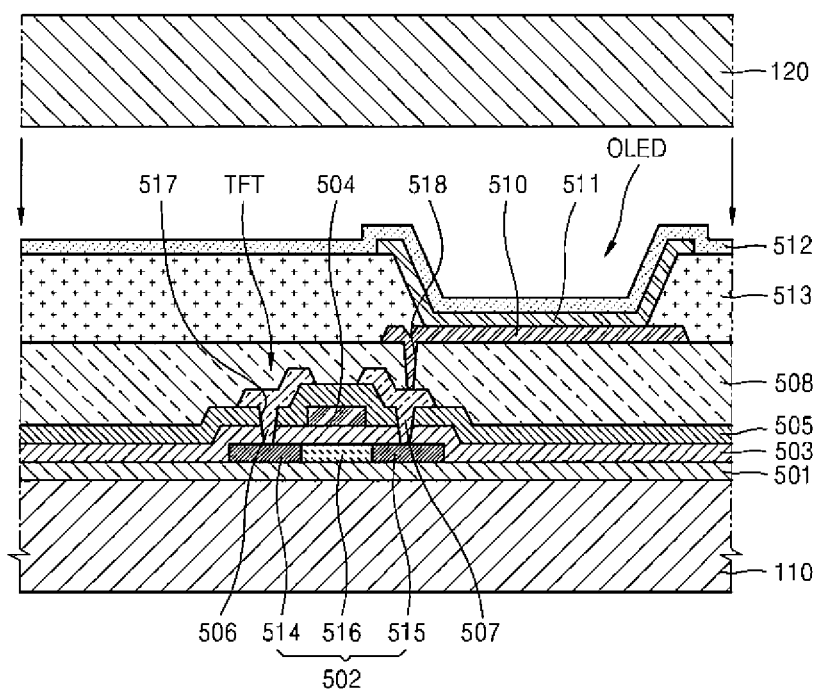
FIG. 5 is a cross-sectional view illustrating a sub pixel of the display apparatus of FIG. 1.

FIG. 5 is a cross-sectional view illustrating a sub pixel when the display unit 140 of FIG. 1 includes an organic light-emitting device.

Referring to FIG. 5, a barrier layer 501 is formed on the substrate 110. The barrier layer 501 may be formed of an inorganic material such as SiOx, SiNx, SiOn, AlO, AlOn, or the like, an organic material such as acrylic, polyimide, polyester, or the like, or an alternate stack of the organic material and the inorganic material.

The barrier layer 501 blocks oxygen and moisture, prevents moisture or impurities from diffusing through the substrate 110, and provides a planar surface on the substrate 110.

A TFT is formed on the barrier layer 501. The TFT is a top gate TFT in the present example embodiment but may be another kind of TFT such as a bottom gate TFT or the like.

A semiconductor active layer 502 having a set or predetermined pattern is formed on the barrier layer 501. If the semiconductor active layer 502 is to be formed of polysilicon, amorphous silicon may be formed and crystallized to be changed into polysilicon.

Various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, etc. may be applied as a method of crystallizing the amorphous silicon. A method not requiring a high temperature heating process may be used for the substrate 110 of the present example embodiment.

For example, when crystallization is performed in a low temperature polysilicon (LTPS) process, a laser beam is irradiated for a short time to activate the semiconductor active layer 502. Therefore, a time for exposing the substrate 110 to a high temperature of 300° C. or more is removed and a whole process is performed at a temperature of 300° C. or less. Therefore, the substrate 110 may be used to form the TFT.

The semiconductor active layer 502 is doped with N-type or P-type impurity ions to form a source area 514 and a drain area 515 in the semiconductor active layer 502. An area between the source area 514 and the drain area 515 is a channel area 516 that is not doped with impurities.

Alternatively, the semiconductor active layer 502 may be formed of an oxide semiconductor. For example, the oxide semiconductor may include 12, 13, and 14 group metallic elements such as Zn, In, Ga, Sn, Cd, Ge, Hf, etc. and an oxide of a material selected from combinations thereof. For example, the semiconductor active layer 502 may include G-I—Z—O[$(In_2O_3)_a(Ga_2O_3)_b(ZnO)_c$] (wherein a, b, and c are respectively real numbers satisfying conditions of a≥0, b≥0, and c≥0).

A gate insulating layer 503 is deposited on the semiconductor active layer 502. The gate insulating layer 503 may be formed as a single layer formed of $SiO_2$ or a dual layer formed of SiNx.

A gate electrode 504 is formed in a set or predetermined area of the gate insulating layer 503. The gate electrode 504 is connected to a gate line that applies a signal for turning on/off the TFT. The gate electrode 504 may be formed of a single metal or multiple metals. For example, the gate electrode 504 may include a single layer of Au, Ag, Cu, Ni, Pt, Pd, Al, Mo, Cr, or the like, a multilayer thereof, or an alloy of Al:Nd or Mo:W, or the like. Also, the gate electrode 504 may be formed of various kinds of conductive materials in consideration of adhesion, smoothness, electric resistance, processability, etc.

An interlayer insulating layer 505 is formed on the gate electrode 504. The interlayer insulating layer 505 may be formed of an insulating material such as $SiO_2$, SiNx, or an insulating organic material.

A source electrode 506 and a drain electrode 507 are formed on the interlayer insulating layer 505. The gate insulating layer 503 and the interlayer insulating layer 505 are selectively removed to form contact holes 517 in the gate insulating layer 503 and the interlayer insulating layer 505. The source electrode 506 and the drain electrode 507 are respectively electrically connected to the source area 514 and the drain area 510 through the contact holes 517.

The source electrode 506 and the drain electrode 507 may be formed of Au, Pd, Pt, Ni, Rh, Ru, Ir, Os, Al, Mo, or an alloy of two kinds of metals such as an alloy of Al:Nd, an alloy of MoW, or the like but are not limited thereto.

Therefore, the TFT (including the semiconductor active layer 502, the gate electrode 504, and the source and drain electrodes 506 and 507) is formed.

A passivation layer and/or planar layer 508 is formed to cover the source electrode 506 and the drain electrode 507. The passivation layer 508 protects and planarizes the TFT formed underneath the passivation layer 508. The passivation layer 508 may be formed in various suitable shapes and may be formed of an organic material such as Benzocyclobutene (BCB), acrylic, or the like or an inorganic material such as SiNx or the like. The passivation layer 508 may be formed as a single layer, a dual layer, or a multilayer and thus may be variously modified.

A display device is formed on the TFT. The display device is an OLED in the present example embodiment but is not limited thereto. Therefore, various kinds of display devices may be applied.

A first electrode 510 corresponding to a pixel electrode is electrically connected to one of the source and drain electrodes 506 and 507 through a contact hole 518 to form the OLED on the TFT.

The first electrode 510 operates as an anode of electrodes of the OLED and may be formed of various kinds of conductive materials. The first electrode 510 may be formed as a transparent electrode or a reflective electrode according to a purpose thereof.

For example, if the first electrode is used as the transparent electrode, the first electrode 510 may include ITO, IZO, ZnO, $In_2O_3$, or the like. If the first electrode is used as the reflective electrode, a reflective layer may be formed of Ag, Mg, Al, Pt, Pd, Au, Ni, Nd, Ir, Cr, or a compound thereof, and ITO, IZO, ZnO, or $In_2O_3$ may be formed on the reflective layer.

A pixel defined layer (PDL) 513 is formed on the passivation layer 508 to cover an edge of the first electrode 510 of the OLED. An organic layer 511 is formed on the first electrode 510 in a part where the PDL 513 is etched away to expose the first electrode 510.

The organic layer 511 may include a low molecular weight organic material or a high molecular weight organic material.

If the organic layer 511 includes the low molecular weight organic material, a hole injection layer (HIL), a hole transport layer (HTL), an emissive layer (EML), an electron transport layer (ETL), an electron injection layer (EIL), etc. may be stacked in a single structure or in a multilayer structure.

Suitable organic materials include copper phthalocyanine (CuPc), N,N'-Di(naphthalene-1-yl)-N,N'-diphenyl-benzidine (NPB), tris-8-hydroxyquinoline aluminum) (Alq3), etc. The low molecular weight organic material may be formed according to a vacuum deposition method or the like using masks.

If the organic layer 511 includes the high molecular weight organic material, the organic layer 511 may have a structure including an HTL and an EML. The HTL may be formed of poly(3,4-ethylenedioxythiophene) (PEDOT), and the EML may be formed of a poly-phenylenevinylene (PPV)-based or polyfluorene-based high molecular weight organic material. The high molecular weight organic material may be formed according to a screen printing method, an inkjet printing method, or the like.

The organic layer 511 is not limited thereto but may be applied to various example embodiments.

A second electrode 512 corresponding to a common electrode of the OLED is formed on the organic layer 511.

The first and second electrodes 510 and 512 are insulated from each other through the organic layer 511. If a voltage is applied to the first and second electrodes 510 and 512, the organic layer 511 emits visible light to realize an image that may be recognized by a user.

The second electrode 512 may be formed as a transparent electrode or a reflective electrode like the first electrode 510. If the second electrode 512 is used as the transparent electrode, a metal having a low work function, i.e., Li, Ca, LiF/Ca, LiF/Al, Al, Mg, or a compound thereof may be deposited on the organic layer 511, and then an electrode may be formed of a material for forming a transparent electrode, such as ITO, IZO, ZnO, $In_2O_3$, or the like, thereon.

If the second electrode 512 is used as the reflective electrode, Li, Ca, LiF/Ca, LiF/Al, Al, Mg, or a compound thereof may be deposited on an entire surface to form the second electrode 512.

When the first electrode 510 is formed as the transparent electrode or the reflective electrode, the first electrode 510 may be formed in a shape corresponding to a shape of an opening of each sub pixel. The transparent electrode or the reflective electrode may be deposited on an entire surface of a display area to form the second electrode 512.

The encapsulation 120 is formed on the substrate 110. The encapsulation 120 is formed to protect the organic layer 511 and other thin films from external moisture or oxygen.

As described above, in a display apparatus having a sealing portion and a fabrication method thereof according to embodiments of the present invention, structural strength of the sealing portion is improved. A process of fabricating the sealing portion is simplified to secure strength reliability of the sealing portion.

While the present invention has been particularly shown and described with reference to example embodiments thereof, it will be understood by those of ordinary skill in the art that various changes in form and details may be made therein without departing from the spirit and scope of the present invention as defined by the following claims, and equivalents thereof.

What is claimed is:

1. A method of fabricating a sealing portion of a display apparatus, the method comprising:
    irradiating a laser beam at a deposition target spaced apart from a deposition substrate to form a sputtered deposition material,
    forming the sealing portion by depositing the sputtered deposition material on the deposition substrate comprising one of a substrate and an encapsulation, the sealing portion formed at an edge at which the substrate and the encapsulation face each other, wherein a display unit is formed on the substrate, and the encapsulation is for sealing the substrate;
    bonding the substrate and the encapsulation to each other;
    hardening the sealing portion; and
    monitoring the sealing portion, wherein the sealing portion is formed through a low temperature process of 40° C. or less.

2. The method of claim 1, wherein the sealing portion is formed at an edge of at least one of the substrate and the encapsulation.

3. The method of claim 2, wherein the sealing portion is continuously formed along an edge of the display unit.

4. The method of claim 1, wherein the forming of the sealing portion comprises:
    inserting the deposition substrate comprising one of the substrate and the encapsulation into a chamber to install the deposition substrate on a substrate holder;
    installing the deposition target on a target holder that is installed to correspond to the substrate holder; and
    forming the sealing portion on the deposition substrate by using particles generated by irradiating the laser beam onto the deposition target from a laser irradiator installed outside the chamber.

5. The method of claim 4, wherein the laser beam generated from the laser irradiator is a pulse laser beam.

6. The method of claim 4, wherein the sealing portion is formed in a vacuum chamber.

7. The method of claim 1, wherein the hardening of the sealing portion comprises irradiating another laser beam from a laser system installed outside the substrate and the encapsulation that are bonded to each other.

8. The method of claim 7, wherein the laser system comprises a temperature sensor to measure a surface temperature of a part onto which the another laser beam is irradiated, to control an output and a speed of a laser irradiator of the laser system.

9. The method of claim 1, wherein the monitoring of the sealing portion comprises monitoring a quality of the sealing portion through a laser ablation system.

10. The method of claim 1, wherein the sealing portion comprises glass frit.

* * * * *